(12) United States Patent
Iijima et al.

(10) Patent No.: US 11,037,780 B2
(45) Date of Patent: Jun. 15, 2021

(54) METHOD FOR MANUFACTURING SEMICONDUCTOR DEVICE WITH HELIUM-CONTAINING GAS

(71) Applicant: ASM IP Holding B.V., Almere (NL)

(72) Inventors: Toshiaki Iijima, Tama (JP); Masaki Tokunaga, Hino (JP); Jun Kawahara, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/838,428

(22) Filed: Dec. 12, 2017

(65) Prior Publication Data

US 2019/0181002 A1   Jun. 13, 2019

(51) Int. Cl.
| | | |
|---|---|---|
| H01L 21/02 | (2006.01) | |
| C23C 16/34 | (2006.01) | |
| C23C 16/455 | (2006.01) | |
| C23C 16/50 | (2006.01) | |

(52) U.S. Cl.
CPC ........ *H01L 21/0217* (2013.01); *C23C 16/345* (2013.01); *C23C 16/45544* (2013.01); *C23C 16/50* (2013.01); *H01L 21/0228* (2013.01); *H01L 21/0234* (2013.01); *H01L 21/02164* (2013.01); *H01L 21/02274* (2013.01)

(58) Field of Classification Search
CPC ........... H01L 21/0217; H01L 21/02274; H01L 21/0234; H01L 21/02334; H01L 21/02252; H01L 21/02315; H01L 21/76855; C23C 16/345; C23C 16/56
See application file for complete search history.

(56) References Cited

U.S. PATENT DOCUMENTS

| | | | |
|---|---|---|---|
| 8,647,722 B2 | 2/2014 | Kobayashi et al. | |
| 9,214,333 B1* | 12/2015 | Sims | H01L 21/0217 |
| 2004/0121085 A1* | 6/2004 | Wang | C23C 16/34 |
| | | | 427/569 |
| 2005/0181633 A1* | 8/2005 | Hochberg | C23C 16/24 |
| | | | 438/787 |
| 2012/0267341 A1* | 10/2012 | Kato | H01L 21/02164 |
| | | | 216/37 |
| 2013/0005154 A1* | 1/2013 | Lee | H01L 21/02164 |
| | | | 438/763 |
| 2013/0183835 A1* | 7/2013 | Nguyen | C23C 16/345 |
| | | | 438/793 |
| 2014/0023794 A1* | 1/2014 | Mahajani | C23C 16/325 |
| | | | 427/535 |
| 2017/0062204 A1 | 3/2017 | Suzuki et al. | |

* cited by examiner

*Primary Examiner* — Laura M Menz
*Assistant Examiner* — Candice Chan
(74) *Attorney, Agent, or Firm* — Studebaker & Brackett PC

(57) ABSTRACT

A method for manufacturing a semiconductor device includes forming a SiN film on a substrate. Plasma treatment is applied to the SiN film using a He-containing gas.

10 Claims, 3 Drawing Sheets

METHOD FOR MANUFACTURING SEMICONDUCTOR DEVICE WITH HELIUM-CONTAINING GAS

BACKGROUND

Field

Examples are described which relate to a method for manufacturing a semiconductor device.

Background Art

Silicon nitride (SiN) films have an anti-oxidant property and are used as protective films for substrates. SiN films formed using a PEALD method exhibit excellent step coverage in addition to the anti-oxidant property, and so there are expectations for their function as anti-oxidation films for electrode metals or the like.

The SiN films have a problem that their anti-oxidant property deteriorates when the SiN films are thinned down to 2 nm or less. That is, the SiN films having a thickness of 2 nm or less cannot sufficiently prevent oxidation of the substrates of the SiN films.

SUMMARY

Some examples described herein may address the above-described problems. Some examples described herein may provide a method for manufacturing a semiconductor device capable of enhancing a function of a SiN film as an anti-oxidation film.

In some examples, a method for manufacturing a semiconductor device includes forming a SiN film on a substrate, and applying plasma treatment to the SiN film using a He-containing gas.

DETAILED DESCRIPTION

Figure 1:
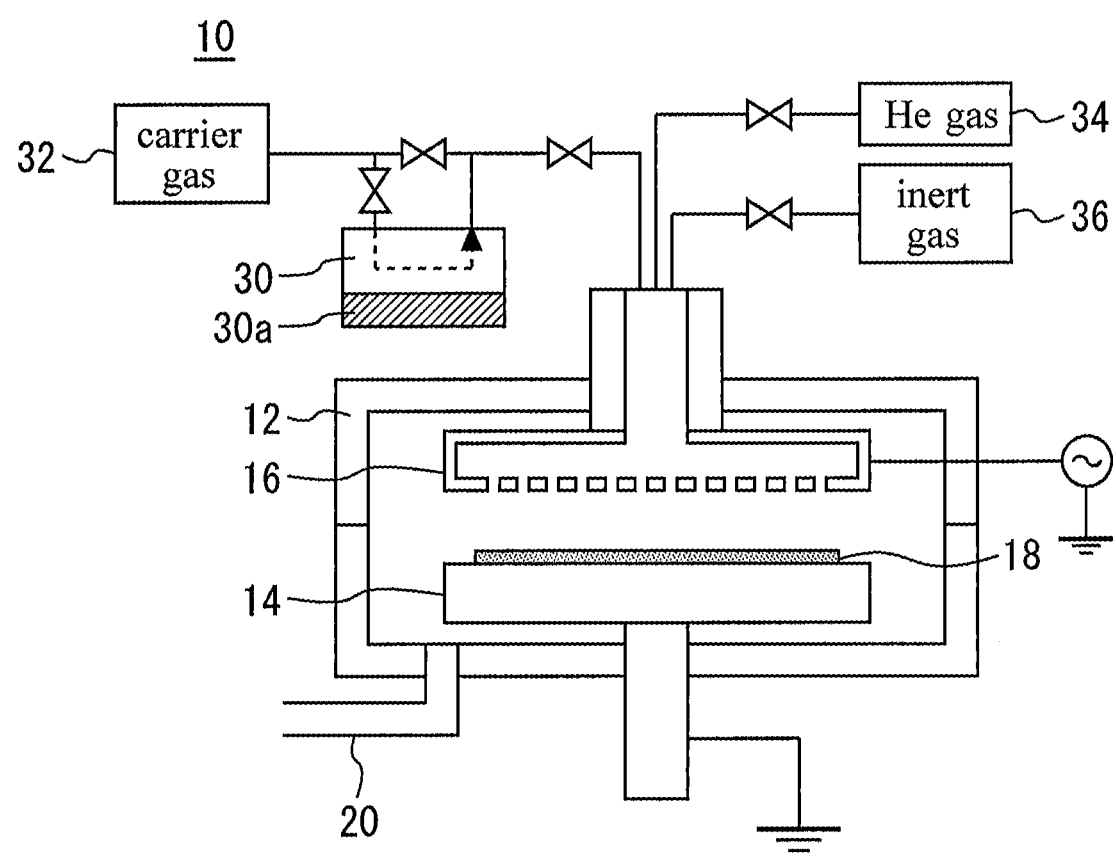
FIG. 1 is a diagram illustrating a film formation apparatus.

A method for manufacturing a semiconductor device according to an embodiment will be described with reference to the accompanying drawings. The same or corresponding components will be assigned the same reference numerals and duplicate description may be omitted.

FIG. 1 is a diagram illustrating a film formation apparatus 10 used in the method for manufacturing a semiconductor device according to an embodiment. The film formation apparatus 10 is provided with a chamber 12. A susceptor 14 and a shower head 16 placed opposite to the susceptor 14 are provided inside the chamber 12. The susceptor 14 is configured to support a substrate 18. The substrate 18 is, for example, a Si substrate. The susceptor 14 is grounded. A space for supplying a gas is formed in the shower head 16 above the susceptor 14. The gas in the chamber 12 is exhausted from an exhaust pipe 20. A high frequency power supply is connected to the shower head 16 and can apply high frequency power to the shower head 16. The film formation apparatus 10 includes the susceptor 14 and the shower head 16 as parallel plates, and can generate capacitive coupling plasma (CCP).

A gas for film formation or treatment on the substrate 18 is supplied above the susceptor 14 through an inner space of the shower head 16. A carrier gas supplied from a carrier gas source 32 is supplied together with vapor of a liquid 30a in a liquid tank 30 above the susceptor 14 through the space in the shower head 16. The liquid 30a is a precursor for forming a SiN film. Such a precursor is, for example, $SiH_2I_2$.

A He gas source 34 is provided to supply a He gas above the susceptor 14. Furthermore, an inert gas source 36 is provided to supply an inert gas above the susceptor 14.

Figure 2:
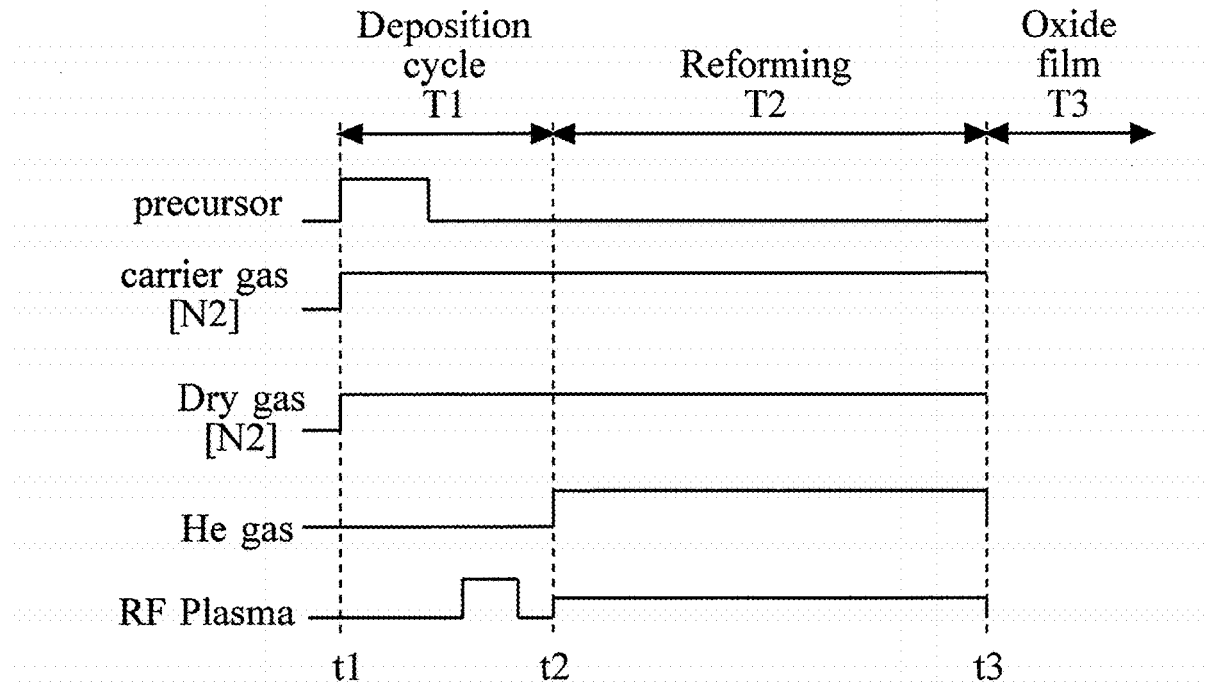
FIG. 2 is a timing chart illustrating an example of the method for manufacturing a semiconductor device.

FIG. 2 is a timing chart illustrating an example of the method for manufacturing a semiconductor device. This timing chart shows a period T1 in which a SiN film is formed, a period T2 in which the SiN film is reformed and a period T3 in which an oxide film is formed.

During the period T1, a SiN film is formed on the substrate 18. The SiN film can be formed using a PE-ALD method. More specifically, a precursor is supplied into the chamber 12 first, and then, a purge is performed to exhaust unnecessary materials. After that, high frequency power (RF power) is applied to the shower head 16 to thereby generate plasma and form the SiN film on the substrate 18. A time period during which high frequency power is applied to the shower head 16 is, for example, 3.3 seconds. Finally, a purge is performed to exhaust unnecessary materials. By repeating this series of processes a plurality of times, the SiN film is formed on the substrate 18. The SiN film has a thickness of, for example, 2 nm or less. To form the SiN film on the order of 2 nm, the above-described series of processes is performed in on the order of, for example, 100 to 200 cycles.

Next, during the period T2, plasma treatment using a He-containing gas is applied to the SiN film. During the period T2, at least the He gas is supplied from the He gas source 34 into the chamber 12, and high frequency power is applied to the shower head 16 to generate plasma.

In this plasma treatment, only He may be supplied into the chamber 12 or a mixed gas of He and an inert gas such as Ar or $N_2$ may be supplied into the chamber 12. FIG. 2 shows an example where a mixed gas of He and $N_2$ is supplied into the chamber 12. That is, $N_2$ which is a carrier gas, $N_2$ which is a dry gas that passes through a route different from that of the carrier gas and He are supplied into the chamber 12. Note that a route running from the carrier gas source 32 to the chamber 12 without passing through the liquid tank 30 can also be provided.

Thus, in plasma treatment during the period T2, the SiN film is subjected to treatment using capacitive coupling plasma. The period T2 is, for example, on the order of 5 minutes. RF power during the period T2 may be made smaller than RF power used during the period T1. For example, the RF power during the period T2 is on the order of half the RF power used during the period T1. A pressure in the chamber during plasma treatment may be set to 1000 Pa or above.

Next, during the period T3, an oxide film is formed on the SiN film. It is possible to adopt any kind of known methods as the method for forming the oxide film. During the period T3, for example, a SiO film is formed on the SiN film.

Figure 3:
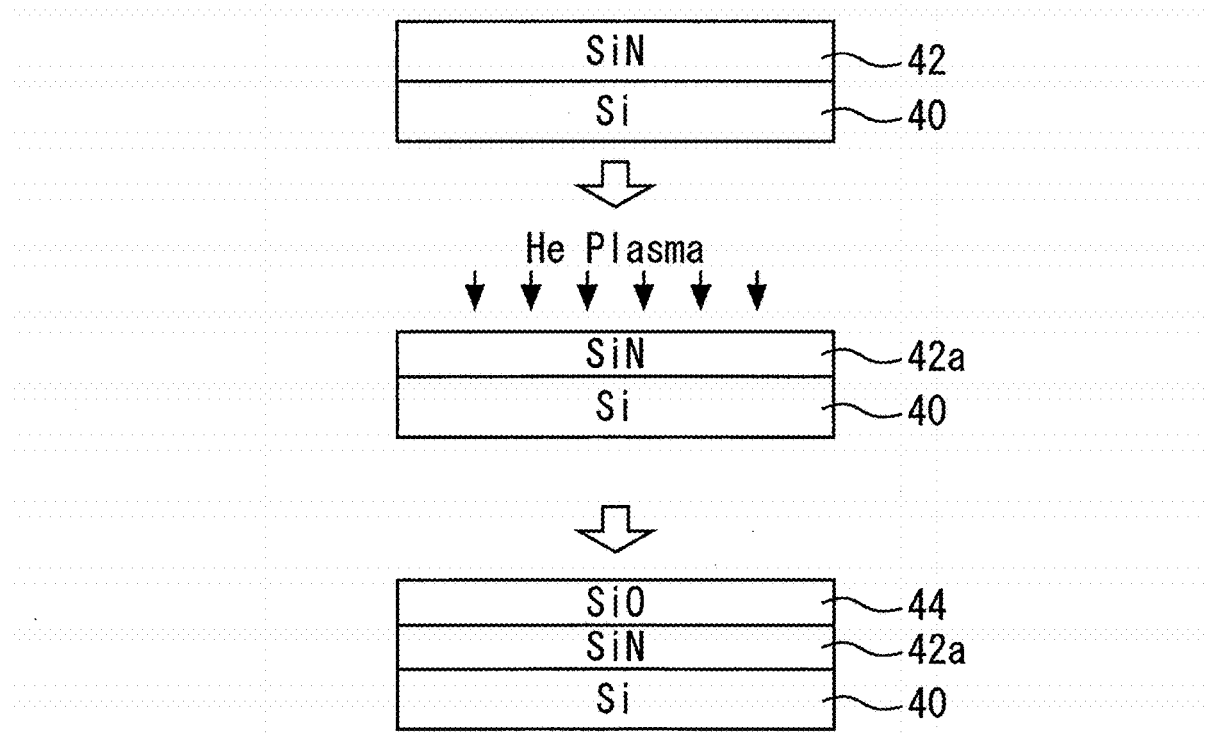
FIG. 3 is a cross-sectional view of the semiconductor device.

FIG. 3 is a cross-sectional view of the semiconductor device. The top row shows that a SiN film 42 is formed on a Si substrate 40 during the period T1. The SiN film 42 is extremely thin, and is, for example, 2 nm or less. The middle row shows that He plasma treatment is performed during the period T2. The SiN film 42 is reformed into a SiN film 42a by He plasma radicals and ions. The SiN film 42a is considered to be a film having a higher density than the SiN film 42. He plasma is considered to possibly drive impurities out of the SiN film 42. For that reason, the SiN film 42a is considered to be a film containing less impurities such as oxygen or hydrogen than the SiN film 42.

The bottom row in FIG. 3 shows that an oxide film 44 is formed on the SiN film 42 during the period T3. Oxidation of the Si substrate 40 associated with the formation of the oxide film 44 is inhibited by the reformed SiN film 42a. That is, the SiN film 42a functions as an anti-oxidation film.

Figure 4:
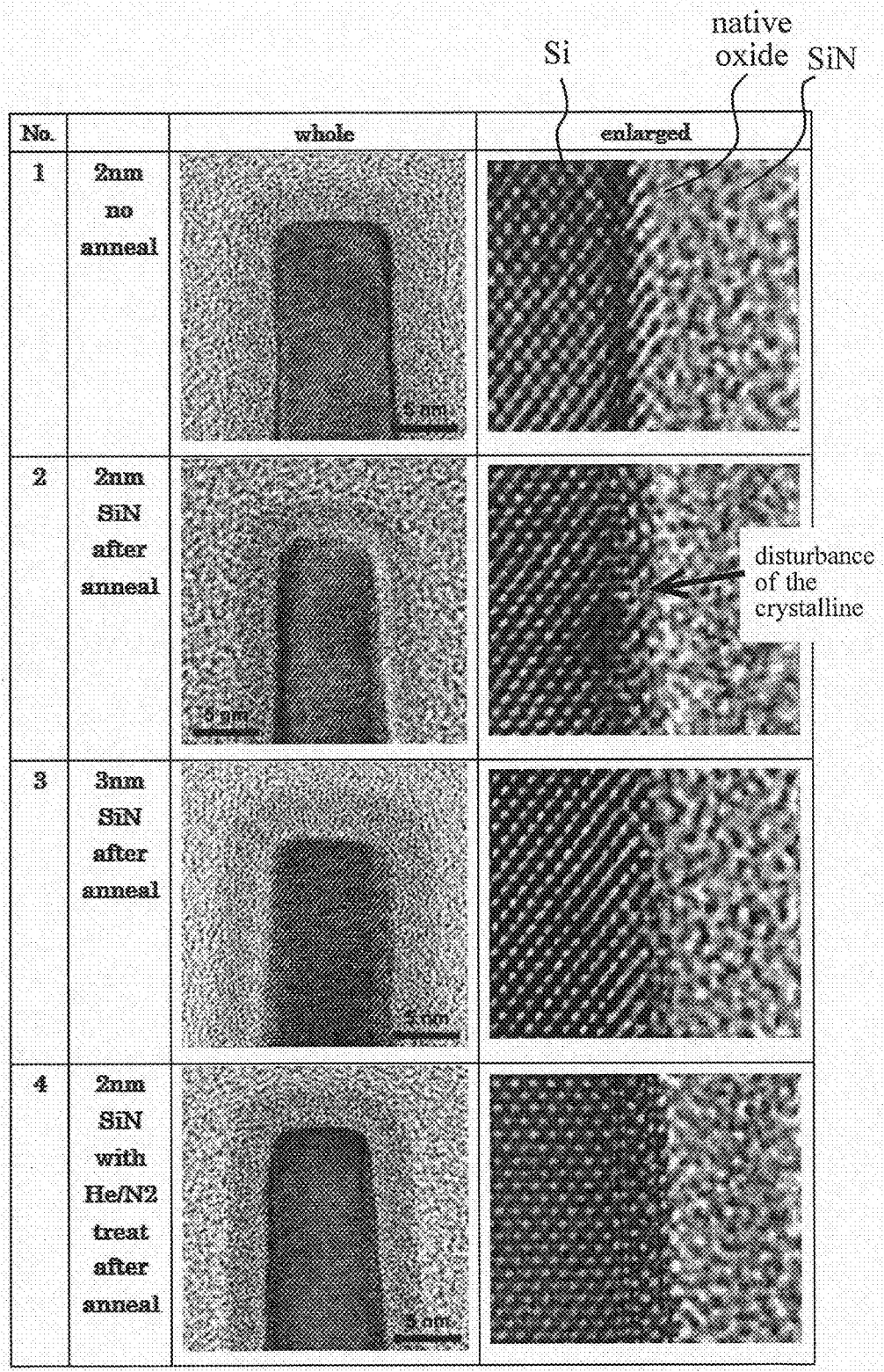
FIG. 4 shows transmission electron microscope images of four samples.

This will be described with reference to actual experiment results. FIG. 4 shows transmission electron microscope (TEM) images of four samples. The four samples are common in that a SiN film is formed on a Si substrate but they are different in specific treatment conditions.

Sample No. 1 shows a SiN film having a thickness of 2 nm formed using PEALD. This TEM image shows that a crystalline structure of Si is kept up to the surface of the sample.

Sample No. 2 is a sample in which a SiN film having a thickness of 2 nm is formed using PEALD, and then annealed for 5 minutes at 800° C. under an oxygen atmosphere. In a TEM image of sample No. 2, a disturbance of the crystalline structure within a range of up to 1 nm from the substrate surface is observed. This disturbance of the crystalline structure means that oxygen used for annealing passes through the SiN film and the Si substrate as the substrate is oxidized. That is, it is considered that the surface of the Si substrate is oxidized and a $SiO_2$ film is generated.

Sample No. 3 is a sample in which a SiN film having a thickness of 3 nm is formed using PEALD, and then annealed for 5 minutes at 800° C. under an oxygen atmosphere. It is seen from a TEM image of sample No. 3 that the crystalline structure of Si is kept up to the surface of the sample. From the results of Nos. 2 and 3, it is seen that if the thickness of the SiN film is 3 nm, although oxidation of the Si substrate can be inhibited even when it is annealed, whereas if the SiN film is thinned down to 2 nm, it is no longer possible to inhibit oxidation of the SiN substrate.

Sample No. 4 is a sample in which a SiN film having a thickness of 2 nm is formed using PEALD, and then subjected to treatment using plasma of a mixed gas of He and $N_2$, and then annealed for 5 minutes at 800° C. under an oxygen atmosphere. In the treatment, it is assumed that a flow rate ratio of He and $N_2$ is 2:1, a pressure is 3000 Pa, high frequency power is 400 W, and a treatment time is 5 minutes. A difference from No. 2 is that plasma treatment is conducted using a He-containing gas.

A comparison between the TEM image of sample No. 4 and the TEM image of sample No. 2 shows that although both images are common in that the SiN film is 2 nm thick, No. 4 can inhibit disturbance of the crystalline structure better than No. 2. That is, in the case of No. 4, the disturbance of the crystalline structure extends only to a shallow depth from the substrate surface. Therefore, applying He gas plasma treatment to the SiN film allows the function of the SiN film as an anti-oxidation film to improve. To further improve the function of the SiN film as an anti-oxidation film, the flow rate of the He gas may be made greater than the flow rate of the inert gas during the plasma treatment.

When only the He gas is used during the period T2 in FIG. 2, the plasma density may become excessively high, causing abnormal discharge. Therefore, an inert gas such as $N_2$ may be supplied to reduce the plasma density, and thereby inhibit abnormal discharge. That is, the inert gas is supplied to prevent RF errors. Since various factors such as an apparatus configuration, gas flow rate or RF power contribute to whether or not abnormal discharge occurs, the inert gas can be basically omitted if there is no possibility of abnormal discharge.

Providing the inert gas source 36 may make it possible in some examples to adjust the flow rate ratio of He and the inert gas during the period T2 without adjusting the flow rate of the gas supplied from the carrier gas source 32. He plasma treatment may also be applied in the middle of ALD plural times during the period T1. However, if the thickness of the SiN film formed during the period T1 is on the order of 2 nm, the necessity for He plasma treatment in the middle of T1 is considered to be low.

According to the some examples, by applying the He plasma treatment to the SiN film, it may be possible to enhance a function of the SiN film as an anti-oxidation film.

What is claimed is:

1. A method for manufacturing a semiconductor device, comprising:
    forming a SiN film on a Si substrate in the absence of He gas; and
    after forming the entire SiN film, applying plasma treatment to the SiN film using a gas consisting of He or consisting of He and at least one of Ar or $N_2$ to increase the density of the SiN film,
    wherein an RF power used during the plasma treatment to the SiN film is smaller than an RF power used during forming the SiN film on the Si substrate, and
    there is more than one monolayer of SiN in the SiN film.

2. The method for manufacturing a semiconductor device according to claim 1, comprising forming an oxide film on the SiN film after the plasma treatment.

3. The method for manufacturing a semiconductor device according to claim 1, wherein a mixed gas of He and an inert gas such as Ar or $N_2$ is used for the plasma treatment.

4. The method for manufacturing a semiconductor device according to claim 3, wherein the flow rate of He is made greater than the flow rate of the inert gas in the plasma treatment.

5. The method for manufacturing a semiconductor device according to claim 1, wherein the thickness of the SiN film is 2 nm or less.

6. The method for manufacturing a semiconductor device according to claim 1, wherein a pressure in a chamber during the plasma treatment is 1000 Pa or more.

7. The method for manufacturing a semiconductor device according to claim 1, wherein capacitive coupling plasma is used in the plasma treatment.

8. A method for manufacturing a semiconductor device, comprising:
    forming a SiN film on a substrate in the absence of He gas; and
    after forming the entire SiN film, applying plasma treatment to the SiN film using only a gas consisting of He or consisting of He and at least one of Ar or $N_2$ to increase the density of the SiN film,
    wherein an RF power used during the plasma treatment to the SiN film is smaller than an RF power used during forming the SiN film on the substrate, and
    there is more than one monolayer of SiN in the SiN film.

9. A method for manufacturing a semiconductor device, comprising:
    forming a SiN film on a substrate in the absence of He gas by using $SiH_2I_2$; and
    after forming the entire SiN film, applying plasma treatment to the SiN film using a gas consisting of He or consisting of He and at least one of Ar or $N_2$ to increase the density of the SiN film, wherein an RF power used during the plasma treatment to the SiN film is smaller than an RF power used during forming the SiN film on the substrate, and there is more than one monolayer of SiN in the SiN film.

10. The method for manufacturing a semiconductor device according to claim 9, wherein during the formation of the SiN film, a $N_2$ gas is used.

* * * * *